US011417500B2

(12) United States Patent
Sasaki et al.

(10) Patent No.: US 11,417,500 B2
(45) Date of Patent: Aug. 16, 2022

(54) PLASMA PROCESSING APPARATUS AND PLASMA PROCESSING METHOD

(71) Applicant: Tokyo Electron Limited, Tokyo (JP)

(72) Inventors: Junichi Sasaki, Miyagi (JP); Yasuharu Sasaki, Miyagi (JP); Hidetoshi Hanaoka, Miyagi (JP); Tomohiko Akiyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 144 days.

(21) Appl. No.: 17/027,792

(22) Filed: Sep. 22, 2020

(65) Prior Publication Data

US 2021/0118647 A1 Apr. 22, 2021

(30) Foreign Application Priority Data

Oct. 17, 2019 (JP) .............................. JP2019-190052

(51) Int. Cl.
*H01J 37/32* (2006.01)
*H01L 21/311* (2006.01)
*H01L 21/683* (2006.01)

(52) U.S. Cl.
CPC .. *H01J 37/32082* (2013.01); *H01J 37/32449* (2013.01); *H01J 37/32642* (2013.01); *H01J 37/32715* (2013.01); *H01L 21/31144* (2013.01); *H01L 21/6833* (2013.01); *H01J 2237/334* (2013.01)

(58) Field of Classification Search
CPC ........... H01J 37/32082; H01J 37/32449; H01J 37/32642; H01J 37/32715; H01J 2237/334; H01J 37/32174; H01J 37/32541; H01J 2237/3341; H01L 21/31144; H01L 21/6833

See application file for complete search history.

(56) References Cited

U.S. PATENT DOCUMENTS

| | | | |
|---|---|---|---|
| 2016/0189994 A1* | 6/2016 | Sasaki | H02N 13/00 361/234 |
| 2017/0018411 A1* | 1/2017 | Sriraman | H01J 37/32495 |
| 2020/0266088 A1* | 8/2020 | Kosakai | H02N 13/00 |

FOREIGN PATENT DOCUMENTS

JP 2016-122740 A 7/2016

* cited by examiner

*Primary Examiner* — Renan Luque
(74) *Attorney, Agent, or Firm* — Studebaker & Brackett PC

(57) ABSTRACT

A disclose substrate support of a plasma processing apparatus has an electrostatic chuck that holds an edge ring. The electrostatic chuck includes a first electrode and a second electrode. In an execution period of a first plasma processing on a substrate, first potentials which are ones out of potentials same as each other and potentials different from each other are set to the first and second electrodes, respectively. In an execution period of a second plasma processing on the substrate, second potentials which are others out of the potentials same as each other and the potentials different from each other are set to the first and second electrodes, respectively. The respective potentials of the first electrode and the second electrode are switched from the first potentials to the second potentials.

17 Claims, 11 Drawing Sheets

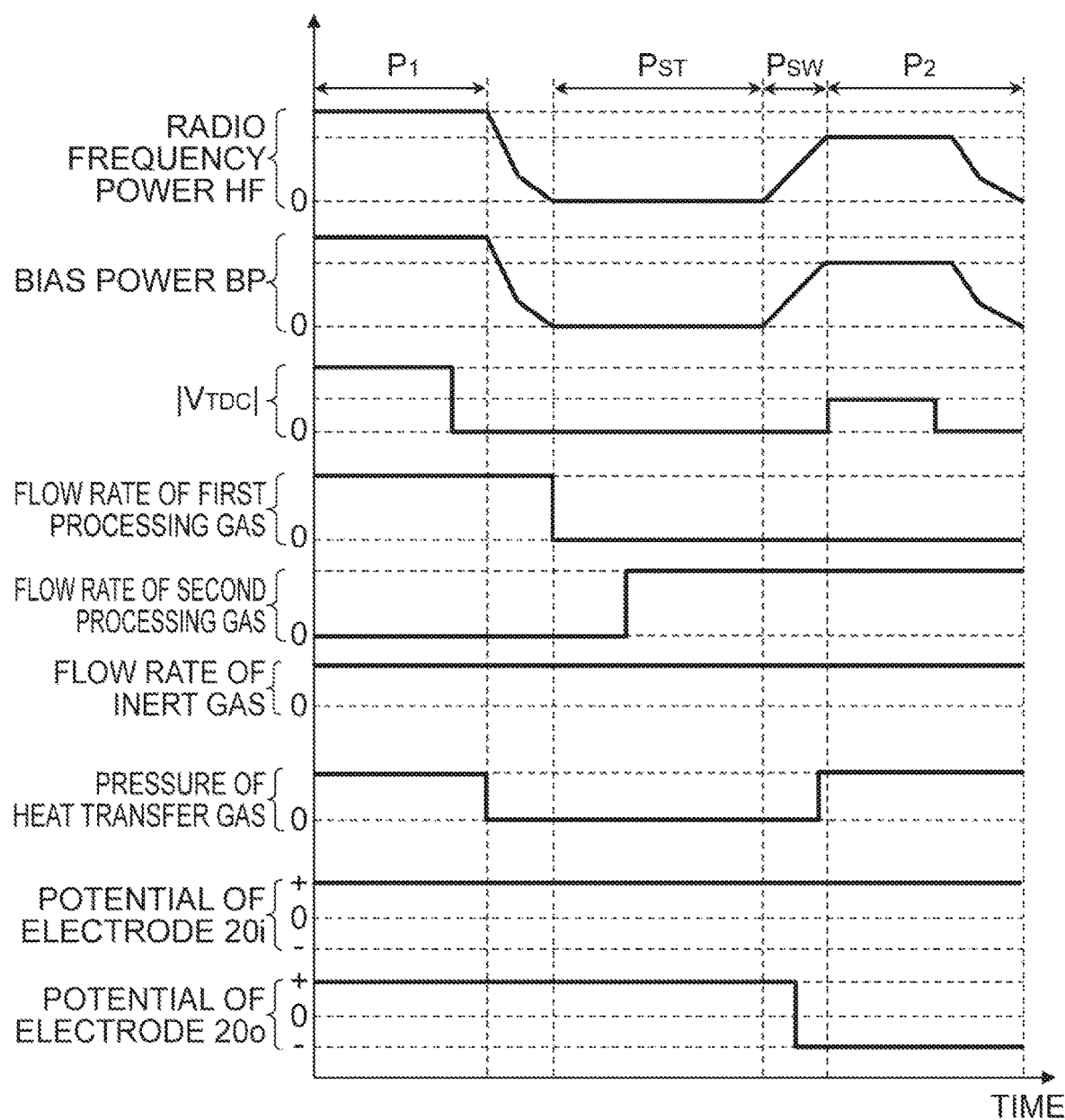

PLASMA PROCESSING APPARATUS AND PLASMA PROCESSING METHOD

CROSS-REFERENCE TO RELATED APPLICATIONS

This application is based on and claims the benefit of priority from Japanese Patent Application No. 2019-190052 filed on Oct. 17, 2019, the entire contents of which are incorporated herein by reference.

FIELD

Exemplary embodiments of the present disclosure relate to a plasma processing apparatus and a plasma processing method.

BACKGROUND

A plasma processing apparatus is used for plasma processing on a substrate. The plasma processing apparatus includes a chamber and a substrate support. The substrate support is configured to support the substrate within the chamber. An edge ring is mounted on the substrate support. The substrate is disposed in the region surrounded by the edge ring. The edge ring is sometimes called a focus ring.

The substrate support may have an electrostatic chuck configured to hold the edge ring. The electrostatic chuck configured to hold the edge ring is a bipolar electrostatic chuck and includes two electrodes. A plasma processing apparatus having such an electrostatic chuck is described in Japanese Patent Application Laid-Open Publication No. 2016-122740.

SUMMARY

In one exemplary embodiment, a plasma processing apparatus is provided. The plasma processing apparatus includes a chamber, a substrate support, one or more power supplies, a radio frequency power supply, a bias power supply, and a controller. The substrate support is configured to support the substrate within the chamber. The substrate support has a lower electrode and an electrostatic chuck. The electrostatic chuck has a first electrode and a second electrode. The electrostatic chuck is configured to hold the edge ring by an electrostatic force generated according to potentials respectively set on the first electrode and the second electrode. One or more power supplies are electrically connected to the first electrode and the second electrode. The radio frequency power supply is configured to supply radio frequency power to generate plasma in the chamber. The bias power supply is configured to supply bias power to the lower electrode. The controller is configured to control the one or more power supplies, the radio frequency power supply, and the bias power supply. The controller controls the radio frequency power supply and the bias power supply to perform a first plasma processing on the substrate placed on the substrate support. The controller controls one or more power supplies to set a potential of the first electrode and a potential of the second electrode in the execution period of the first plasma processing to first potentials which are ones out of potentials same as each other and potentials different from each other. The controller controls the radio frequency power supply and the bias power supply to perform a second plasma processing on the substrate placed on the substrate support. The controller sets an effective value of at least one power of the radio frequency power or the bias power in the execution period of the second plasma processing to a value different from the effective value of the at least one power in the execution period of the first plasma processing. The controller controls the one or more power supplies to set a potential of the first electrode and a potential of the second electrode in the execution period of the second plasma processing to second potentials which are others out of the potentials same as each other and the potentials different from each other. The controller controls one or more power supplies to switch the respective potential of the first electrode and the second electrode from the first potentials to the second potentials in a switching period, in a state where plasma is generated in the chamber. The switching period is a period between the execution period of the first plasma processing and the execution period of the second plasma processing.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 11 is a timing chart of yet another example related to the plasma processing method according to one exemplary embodiment.

DETAILED DESCRIPTION

Figure 1:
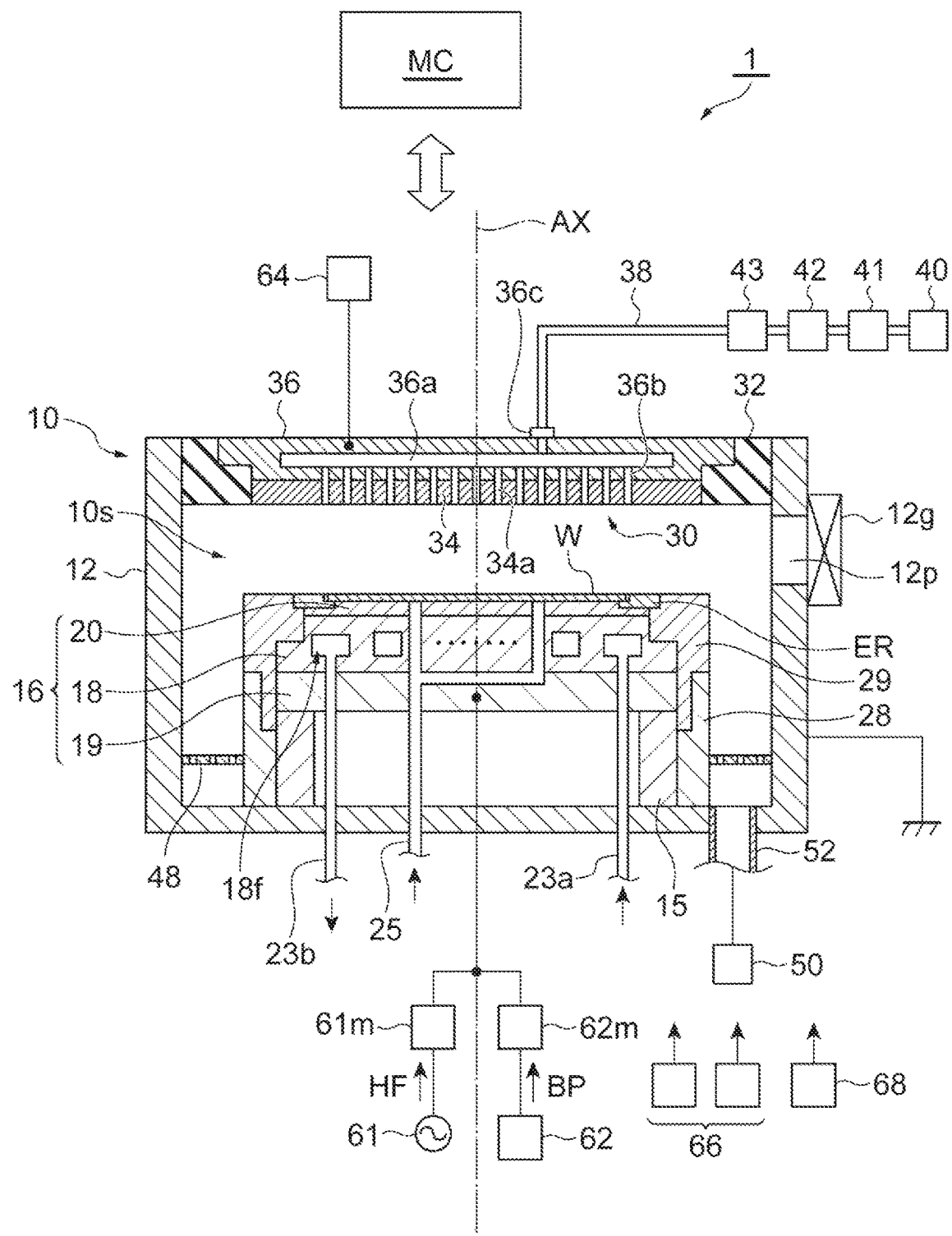
FIG. 1 is a diagram schematically illustrating a plasma processing apparatus according to one exemplary embodiment.

Hereinafter, various exemplary embodiments will be described.

In one exemplary embodiment, a plasma processing apparatus is provided. The plasma processing apparatus includes a chamber, a substrate support, one or more power supplies, a radio frequency power supply, a bias power supply, and a controller. The substrate support is configured to support the substrate within the chamber. The substrate support has a lower electrode and an electrostatic chuck. The electrostatic chuck has a first electrode and a second electrode. The electrostatic chuck is configured to hold the edge ring by an electrostatic force generated according to potentials respectively set on the first electrode and the second electrode. One or more power supplies are electrically connected to the first electrode and the second electrode. The radio frequency power supply is configured to supply radio frequency power to generate plasma in the chamber. The bias power supply is configured to supply bias power to the lower electrode. The controller is configured to control the one or more power supplies, the radio frequency power supply, and the bias power supply. The controller controls the radio frequency power supply and the bias power supply to perform a first plasma processing on the substrate placed on the substrate support. The controller controls one or more power supplies to set a potential of the first electrode and a potential of the second electrode in the execution period of the first plasma processing to first potentials which are ones out of potentials same as each other and potentials different from each other. The controller controls the radio frequency power supply and the bias power supply to perform a second plasma processing on the substrate placed on the substrate support. The controller sets an effective value of at least one power of the radio frequency power or the bias power in the execution period of the second plasma processing to a value different from the effective value of the at least one power in the execution period of the first plasma processing. The controller controls the one or more power supplies to set a potential of the first electrode and a potential of the second electrode in the execution period of the second plasma processing to second potentials which are others out of the potentials same as each other and the potentials different from each other. The controller controls one or more power supplies to switch the respective potential of the first electrode and the second electrode from the first potentials to the second potentials in a switching period, in a state where plasma is generated in the chamber. The switching period is a period between the execution period of the first plasma processing and the execution period of the second plasma processing.

In the above embodiment, the potential of the first electrode and the potential of the second electrode are set to ones out of the potentials same as each other and the potentials different from each other, in the execution period of the first plasma processing. That is, the electrostatic chuck functions in one mode of the monopolar mode and the bipolar mode, in the execution period of the first plasma processing. The potential of the first electrode and the potential of the second electrode are respectively set to the others out of the potentials same as each other and the potentials different from each other, in the execution period of the second plasma processing. That is, the electrostatic chuck functions in the other of the monopolar mode and the bipolar mode, in the execution period of the second plasma processing. In the above embodiment, the mode of the electrostatic chuck is switched from the one mode to the other mode, in the switching period between the execution period of the first plasma processing and the execution period of the second plasma processing. Since plasma is generated in the chamber in the switching period, generation of a large potential difference between the substrate and the edge ring is suppressed. Therefore, according to the above-described embodiment, it becomes possible to suppress the discharge that may occur between the edge ring and the substrate when switching the potentials set in the two electrodes of the electrostatic chuck to hold the edge ring.

In one exemplary embodiment, the effective value of the at least one power in the execution period of the first plasma processing may be larger than the effective value of the at least one power in the execution period of the second plasma processing. In one exemplary embodiment, the controller may control the one or more power supplies to set the potential of the first electrode and the potential of the second electrode to the potentials same as each other in the execution period of the first plasma processing, respectively. The controller may control the one or more power supplies to set the potential of the first electrode and the potential of the second electrode to the potentials different from each other in the execution period of the second plasma processing, respectively.

In one exemplary embodiment, the effective value of the at least one power in the execution period of the first plasma processing may be smaller than the effective value of the at least one power in the execution period of the second plasma processing. In one exemplary embodiment, the controller may control the one or more power supplies to set the potential of the first electrode and the potential of the second electrode to the potentials different from each other in the execution period of the first plasma processing, respectively. The controller may control the one or more power supplies to set the potential of the first electrode and the potential of the second electrode to the potentials same as each other in the execution period of the second plasma processing, respectively.

In one exemplary embodiment, the controller may control the radio frequency power supply and the bias power supply to change a level of the at least one power of the radio frequency power or the bias power.

In one exemplary embodiment, the switching period may be a period immediately after the execution period of the first plasma processing. The controller may control the radio frequency power supply and the bias power supply to gradually reduce the level of the at least one power in the switching period from the level of the at least one power in the execution period of the first plasma processing.

In one exemplary embodiment, the switching period may be a period immediately before the execution period of the second plasma processing. The controller may control the radio frequency power supply and the bias power supply to gradually increase the level of the at least one power in the switching period toward the level of the at least one power in the execution period of the second plasma processing.

In one exemplary embodiment, the controller may control the radio frequency power supply and the bias power supply to stop supply of the radio frequency power and the supply of the bias power between the switching period and the execution period of the second plasma processing.

In one exemplary embodiment, a level of the radio frequency power and/or a level of the bias power may not be set to zero between the execution period of the first plasma processing and the execution period of the second plasma processing.

In one exemplary embodiment, the plasma processing apparatus may further include a gas supply unit configured to supply a first processing gas for the first plasma processing and a second processing gas for the second plasma processing into the chamber. In the switching period, the controller may control the gas supply unit to maintain the flow rate of the first processing gas in the execution period of the first plasma processing.

In one exemplary embodiment, the plasma processing apparatus may further include a gas supply unit configured to supply a first processing gas for the first plasma processing, a second processing gas for the second plasma processing, and an inert gas into the chamber. In the switching period, the controller may control the gas supply unit to supply only the inert gas into the chamber.

In one exemplary embodiment, the first electrode and the second electrode may extend in a circumferential direction around an axis extending in the vertical direction, and the first electrode may extend closer to the axis than the second electrode.

In one exemplary embodiment, as the potentials same as each other, the positive potentials same as each other may be set to the first electrode and the second electrode, respectively. As the potentials different from each other, one of a positive potential and a negative potential may be set for the first electrode, and the other of the positive potential and the negative potential may be set for the second electrode.

In one exemplary embodiment, the plasma processing may further include a heat transfer gas supply unit configured to supply heat transfer gas to a gap between the electrostatic chuck and the edge ring. The controller may control the heat transfer gas supply unit to stop supply of the heat transfer gas to the gap in the switching period.

In another exemplary embodiment, a plasma processing method is provided. The plasma processing method includes executing a first plasma processing on a substrate placed on a substrate support in a chamber of a plasma processing apparatus. The substrate support has a lower electrode and an electrostatic chuck. The electrostatic chuck is configured to hold an edge ring according to potentials set on a first electrode and a second electrode. In an execution period of the first plasma processing, a potential of the first electrode and a potential of the second electrode are set to first potentials, respectively. The first potentials are ones out of potentials same as each other and potentials different from each other. The plasma processing method further includes executing a second plasma processing on the substrate placed on the substrate support in the chamber. In an execution period of the second plasma processing, an effective value of at least one of radio frequency power for plasma generation and bias power supplied to a lower electrode of the substrate support is set to a value different from an effective value of the at least one power in the execution period of the first plasma processing. In the execution period of the second plasma processing, the potential of the first electrode and the potential of the second electrode are set to second potentials, respectively. The second potentials are others out of the potentials same as each other and the potentials different from each other. The plasma processing method further includes switching the respective potentials of the first electrode and the second electrode from the first potentials to the second potentials in a switching period, in a state where plasma is generated in the chamber. The switching period is a period between the execution period of the first plasma processing and the execution period of the second plasma processing.

In one exemplary embodiment, the substrate may have a first film and a second film. The first film may be etched by the first plasma processing, and the second film may be etched by the second plasma processing.

Hereinafter, various exemplary embodiments will be described in detail with reference to the drawings. In the drawing, the same or equivalent portions are denoted by the same reference symbols.

FIG. 1 is a diagram schematically illustrating a plasma processing apparatus according to one exemplary embodiment. The plasma processing apparatus 1 shown in FIG. 1 is a capacitively coupled plasma processing apparatus. The plasma processing apparatus 1 includes a chamber 10. The chamber 10 provides an internal space 10s therein. In one embodiment, chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having plasma resistance is formed on the inner wall surface of the chamber body 12, that is, the wall surface defining the internal space 10s. This film may be a ceramic film such as a film formed by anodizing or a film formed of yttrium oxide.

A passage 12p is formed in a side wall of the chamber body 12. The substrate W passes through the passage 12p when the substrate W is transferred between the internal space 10s and the outside of the chamber 10. A gate valve 12g is provided along the side wall of the chamber body 12 to open and close the passage 12p.

The plasma processing apparatus 1 further includes a substrate support 16. The substrate support 16 is configured to support the substrate W in the chamber 10, that is, in the internal space 10s. The substrate W may have a substantially disk shape. The substrate support 16 is supported by the support 15. The support 15 extends upward from the bottom of the chamber body 12. The support 15 has a substantially cylindrical shape. The support 15 is formed of an insulating material such as quartz.

The substrate support 16 includes a lower electrode 18 and an electrostatic chuck 20. The substrate support 16 may further include an electrode plate 19. The electrode plate 19 is formed of a conductive material such as aluminum, and has a substantially disk shape. The lower electrode 18 is provided on an electrode plate 19. The lower electrode 18 is formed of a conductive material such as aluminum, and has a substantially disk shape. The lower electrode 18 is electrically connected to an electrode plate 19.

In the lower electrode 18, a flow path 18f is formed. The flow path 18f is a flow path for a heat exchange medium. As the heat exchange medium, a liquid refrigerant or a refrigerant (for example, Freon) that cools the lower electrode 18 by vaporization is used. A supply device (for example, a chiller unit) for supplying a heat exchange medium is connected to the flow path 18f. This supply device is provided outside the chamber 10. The heat exchange medium is supplied to the flow path 18f from the supply device via the pipe 23a. The heat exchange medium supplied to the flow path 18f is returned to the supply device via the pipe 23b.

The electrostatic chuck 20 is provided on the lower electrode 18. The edge ring ER is mounted on the electrostatic chuck 20. The edge ring ER has a ring shape. The edge ring ER is formed of, for example, silicon or silicon carbide. The electrostatic chuck 20 is configured to hold the edge ring ER by electrostatic force. The substrate W is disposed on the substrate support 16 and in a region surrounded by the edge ring ER. The substrate W may be placed on the electrostatic chuck 20 and held by the electrostatic chuck 20.

The plasma processing apparatus 1 may further include a gas supply line 25. The gas supply line 25 supplies a heat transfer gas, for example, He gas, from gas supply mechanism to a gap between the upper surface of the electrostatic chuck 20 and the back surface (lower surface) of the substrate W.

The plasma processing apparatus 1 may further include a tubular portion 28 and an insulating portion 29. The tubular portion 28 extends upward from the bottom of the chamber body 12. The tubular portion 28 extends along the outer periphery of the support 15. The tubular portion 28 is formed of a conductive material and has a substantially cylindrical shape. The tubular portion 28 is electrically grounded. The insulating portion 29 is provided on the tubular portion 28. The insulating portion 29 is formed of a material having an insulating property. The insulating portion 29 is formed of, for example, a ceramic such as quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the substrate support 16. The upper electrode 30 together with the member 32 closes the upper opening of the chamber body 12. The member 32 has an insulating property. The upper electrode 30 is supported on the upper part of the chamber body 12 via a member 32.

The upper electrode 30 includes a ceiling plate 34 and a support 36. The lower surface of the ceiling plate 34 defines an internal space 10s. A plurality of gas delivery holes 34a are formed in the ceiling plate 34. Each of the plurality of gas delivery holes 34a penetrates the ceiling plate 34 in the plate thickness direction (vertical direction). The ceiling plate 34 is formed of, for example, but not limited to, silicon. Alternatively, the ceiling plate 34 may have a structure in which a film having plasma resistance is provided on the surface of a member made of aluminum. This film may be a ceramic film such as a film formed by anodizing or a film formed of yttrium oxide.

The support 36 supports the ceiling plate 34 detachably. The support 36 is formed of a conductive material such as aluminum, for example. Inside the support 36, a gas diffusion chamber 36a is provided. A plurality of gas holes 36b extend downward from the gas diffusion chamber 36a. The plurality of gas holes 36b is in communication with the plurality of gas delivery holes 34a, respectively. The support 36 has a gas introduction port 36c formed therein. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The valve group 41, the flow rate controller group 42, and the valve group 43 form a gas supply unit. The gas source group 40 includes a plurality of gas sources. The plurality of gas sources includes one or more gas sources for the first processing gas described below. The plurality of gas sources further includes one or more gas sources for the second processing gas described below. The plurality of gas sources may further include a gas source of inert gas. The inert gas may be, for example, a noble gas.

Each of the valve group 41 and the valve group 43 includes a plurality of valves (for example, open/close valves). The flow rate controller group 42 includes a plurality of flow rate controllers. Each of the plurality of flow rate controllers in the flow rate controller group 42 is a mass flow rate controller or a pressure control type flow rate controller. Each of the plurality of gas sources of the gas source group 40 is connected to the gas supply pipe 38 via a corresponding valve of the valve group 41, a corresponding flow rate controller of the flow rate controller group 42, and a corresponding valve of the valve group 43. The plasma processing apparatus 1 can supply the gas from one or more gas sources selected from among the plurality of gas sources of the gas source group 40 to the internal space 10s at a flow rate individually adjusted.

A baffle member 48 is provided between the tubular portion 28 and the side wall of the chamber body 12. The baffle member 48 may be a plate-shaped member. The baffle member 48 may be configured by, for example, coating a plate made of aluminum with a ceramic such as yttrium oxide. A plurality of through holes are formed in the baffle member 48. Below the baffle member 48, an exhaust pipe 52 is connected to the bottom of the chamber body 12. An exhaust device 50 is connected to the exhaust pipe 52. The exhaust device 50 has a pressure controller such as an automatic pressure control valve and a vacuum pump such as a turbo molecular pump, and can reduce the pressure in the internal space 10s.

The plasma processing apparatus 1 further includes a radio frequency power supply 61. The radio frequency power supply 61 is a power supply that generates radio frequency power HF for plasma generation. The frequency of the radio frequency power HF is not limited, but is within the range of 27 to 100 MHz. The radio frequency power supply 61 is connected to the lower electrode 18 via the matcher 61m and the electrode plate 19 in order to supply the radio frequency power HF to the lower electrode 18. The matcher 61m has a matching circuit. The matching circuit of the matcher 61m has a variable impedance. The impedance of the matching circuit of the matcher 61m is adjusted to reduce reflection from the load of the radio frequency power supply 61. The radio frequency power supply 61 may not be electrically connected to the lower electrode 18 and may be connected to the upper electrode 30 via the matcher 61m.

The plasma processing apparatus 1 further includes a bias power supply 62. The bias power supply 62 generates a bias power BP used to attract ions to the substrate W. The bias power supply 62 is connected to the lower electrode 18 via the electrode plate 19.

In one embodiment, the bias power supply 62 may be a radio frequency power supply that generates radio frequency power. The frequency of the radio frequency power generated by the bias power supply 62 is lower than the frequency of the radio frequency power HF. The frequency of the radio frequency power generated by the bias power supply 62 is, for example, a frequency within the range of 400 kHz to 13.56 MHz. In the embodiment, the bias power supply 62 is connected to the lower electrode 18 via the matcher 62m and the electrode plate 19. The matcher 62m has a matching circuit. The matching circuit of the matcher 62m has a variable impedance. The impedance of the matching circuit of the matcher 62m is adjusted to reduce reflection from the load of the bias power supply 62.

In another embodiment, the bias power supply 62 may be a DC power supply device that intermittently or periodically applies a negative DC voltage pulse to the lower electrode 18. For example, the bias power supply 62 may apply a pulse of a negative DC voltage to the lower electrode 18 at a cycle defined by a frequency within the range of 1 kHz to 1 MHz.

In one embodiment, the plasma processing apparatus 1 may further include a DC power supply device 64. The DC power supply device 64 is connected to the upper electrode 30. The DC power supply device 64 is configured to apply a DC voltage, for example, a negative DC voltage to the upper electrode 30. The DC power supply device 64 may apply intermittently or periodically the pulse of the DC voltage to the upper electrode 30.

When plasma processing is performed in the plasma processing apparatus 1, gas is supplied to the internal space 10s. Then, by supplying the radio frequency power HF, the gas is excited in the internal space 10s. As a result, plasma is generated in the internal space 10s. The substrate W is processed by a chemical species such as ions and/or radicals from the generated plasma. When the bias power BP is supplied to the lower electrode 18, the ions are accelerated toward the substrate W.

The plasma processing apparatus 1 further includes a controller MC. The controller MC is a computer including a processor, a storage device, an input device, a display device, and the like, and controls each unit of the plasma processing apparatus 1. Specifically, the controller MC executes a control program stored in the storage device, and controls each unit of the plasma processing apparatus 1 based on the recipe data stored in the storage device. The process designated by the recipe data is executed in the plasma processing apparatus 1 under the control of the controller MC. The plasma processing methods according to various embodiments described below may be executed in the plasma processing apparatus 1 by the control of each unit of the plasma processing apparatus 1 by the controller MC.

Figure 2:
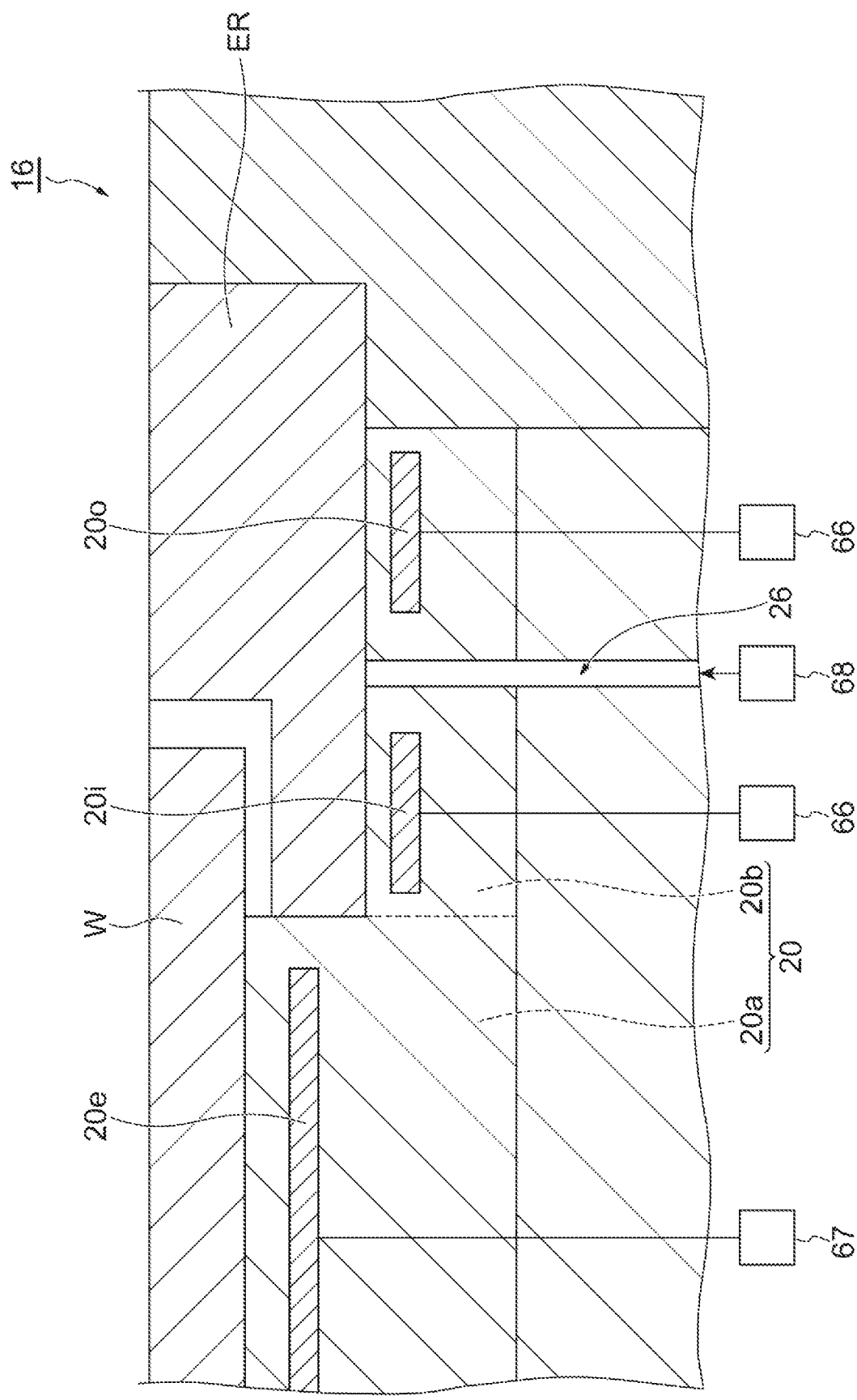
FIG. 2 is a partially enlarged cross-sectional view of a substrate support of a plasma processing apparatus according to one exemplary embodiment.
Figure 3:
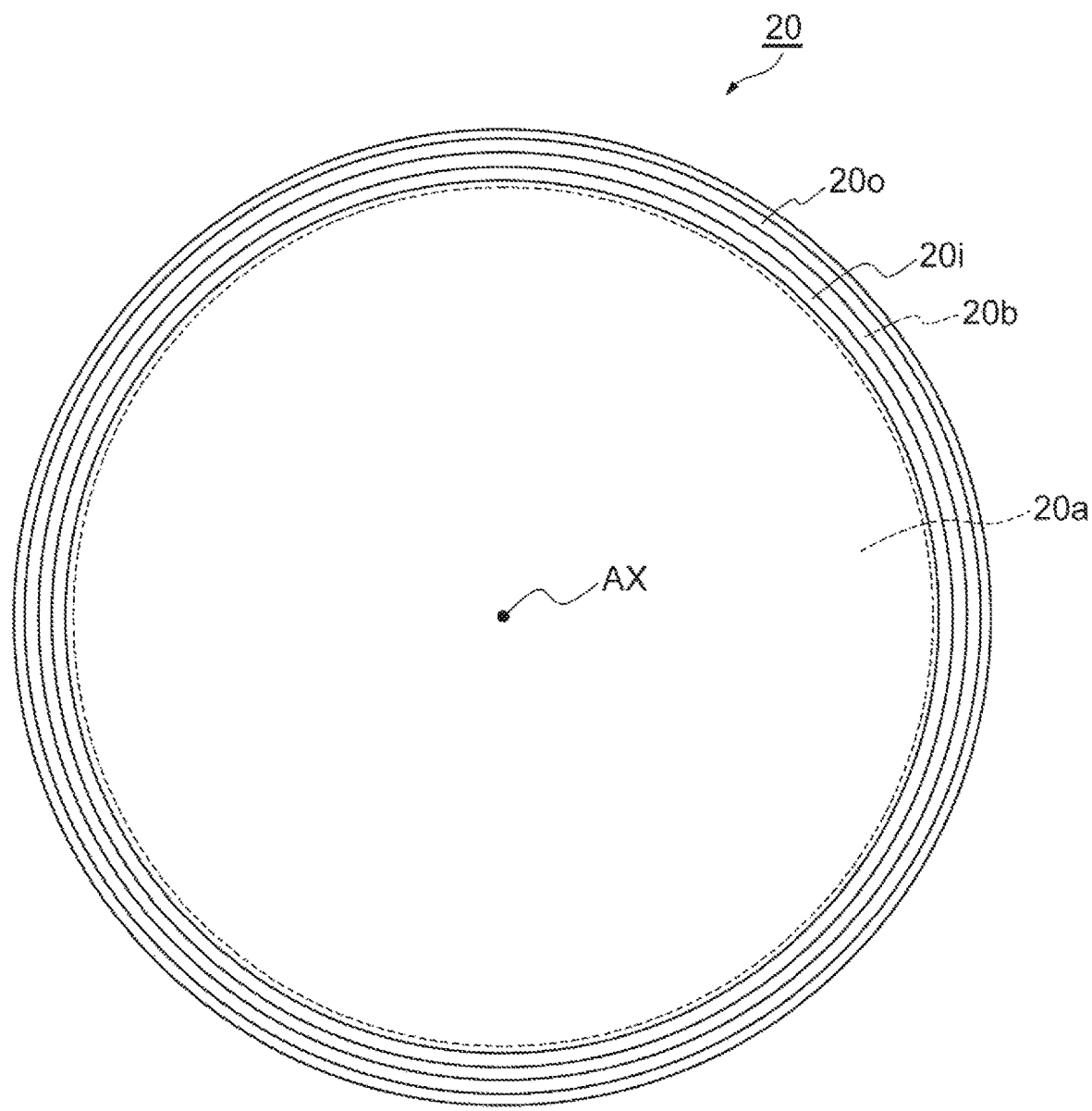
FIG. 3 is a plan view showing an exemplary layout of the first electrode and the second electrode in the electrostatic chuck of the plasma processing apparatus according to one exemplary embodiment.

Hereinafter, FIG. 2 and FIG. 3 will be referred to together with FIG. 1. FIG. 2 is a partially enlarged cross-sectional view of a substrate support of a plasma processing apparatus according to one exemplary embodiment. FIG. 3 is a plan view showing an exemplary layout of the first electrode and the second electrode in the electrostatic chuck of the plasma processing apparatus according to one exemplary embodiment. The electrostatic chuck 20 has a body formed of a dielectric material such as aluminum nitride or aluminum oxide. The electrostatic chuck 20 has several electrodes in its body. These electrodes may include a first electrode 20i and a second electrode 20o. These electrodes may further include electrodes 20e.

In one embodiment, the electrostatic chuck 20 has a first region 20a and a second region 20b. The first region 20a is a substantially circular region in plan view. The central axis of the first region 20a is an axis AX extending in the vertical direction. The axis AX may be the central axis of the chamber 10. The first region 20a is configured to support a substrate placed thereon. An electrode 20e is provided in the first region 20a and in the body. The electrode 20e may be a conductive film. A DC power supply 67 is electrically connected to the electrode 20e. When a DC voltage from the DC power supply 67 is applied to the electrode 20e, an electrostatic force (attractive force) is generated between the substrate W and the first region 20a of the electrostatic chuck 20. The substrate W is attracted to the first region 20a of the electrostatic chuck 20 by the generated electrostatic force and is held by the electrostatic chuck 20.

The second region 20b is an annular region in plan view. The second region 20b extends outside the first region 20a and in the circumferential direction around the axis AX. The second region 20b is configured to hold the edge ring ER mounted thereon. The second region 20b has a first electrode 20i and a second electrode 20o. The first electrode 20i and the second electrode 20o are provided in the second region 20b and in the body of the electrostatic chuck 20. In one embodiment, as shown in FIG. 3, the first electrode 20i and the second electrode 20o extend in the circumferential direction around the axis AX. The first electrode 20i extends closer to the axis AX than the second electrode 20o.

The first electrode 20i and the second electrode 20o are electrically connected to one or more power supplies 66. The one or more power supplies 66 may be direct current power supplies. When potentials (i.e. electrical potentials) are respectively set on the first electrode 20i and the second electrode 20o by one or more power supplies 66, an electrostatic force (attractive force) is generated between the edge ring ER and the second region 20b. Due to the generated electrostatic force, the edge ring ER is attracted to the second region 20b and held by the electrostatic chuck 20.

The one or more power supplies 66 may generate a DC voltage to set the potential of the first electrode 20i and the potential of the second electrode 20o to the potentials same as each other or the potentials different from each other. The setting of the potential of the first electrode 20i and the potential of the second electrode 20o by one or more power supplies 66 is controlled by the controller MC.

In one embodiment, the plasma processing apparatus 1 may further include a heat transfer gas supply unit 68. In the present embodiment, the substrate support 16 provides a gas supply line 26. The heat transfer gas supply unit 68 is configured to supply the inert gas to the gap between the edge ring ER and the electrostatic chuck 20 via the gas supply line 26. The heat transfer gas supply unit 68 can adjust the pressure of the inert gas (for example, He gas) supplied to the gap. The heat transfer gas supply unit 68 may have a flow rate controller for adjusting the pressure of the inert gas.

Figure 4:
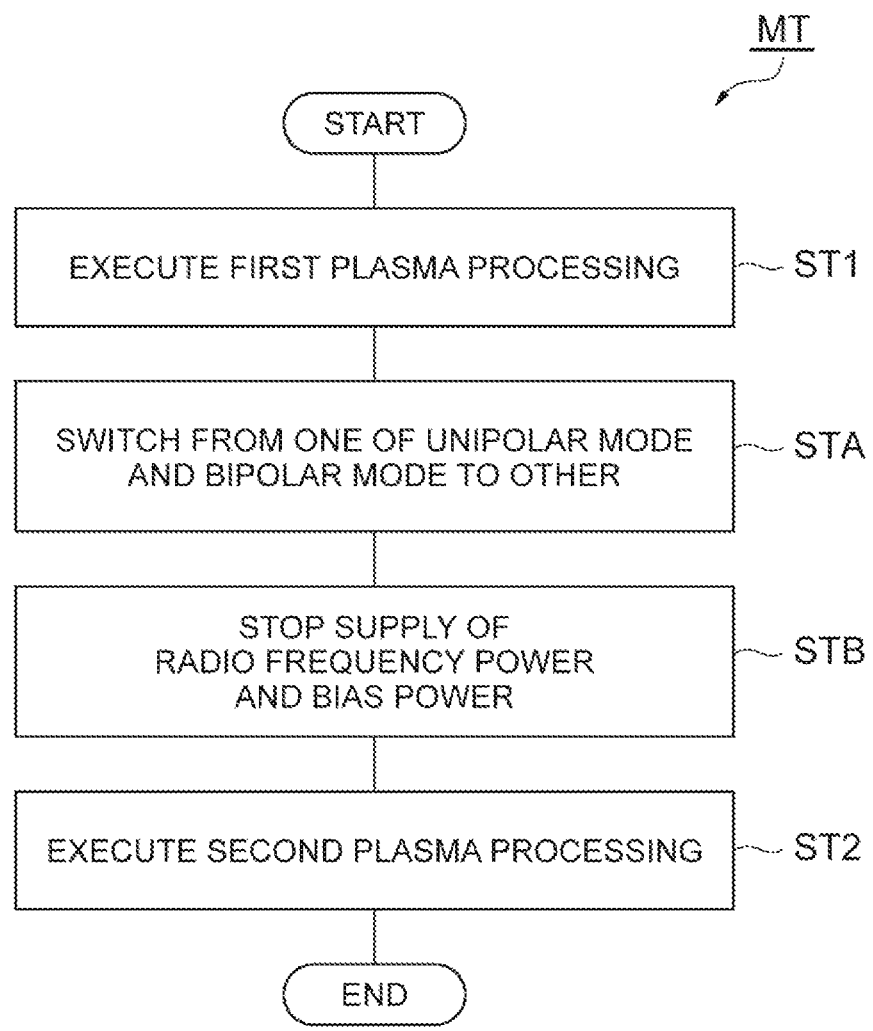
FIG. 4 is a flowchart of a plasma processing method according to one exemplary embodiment.

Reference will be made to FIG. 4. FIG. 4 is a flowchart of a plasma processing method according to one exemplary embodiment. Hereinafter, the plasma processing method shown in FIG. 4 (hereinafter, referred to as "method MT") will be described, taking as an example a case where the plasma processing method is performed using the plasma processing apparatus 1. In the following description, control of each unit of the plasma processing apparatus 1 by the controller MC will also be described.

Figure 5:
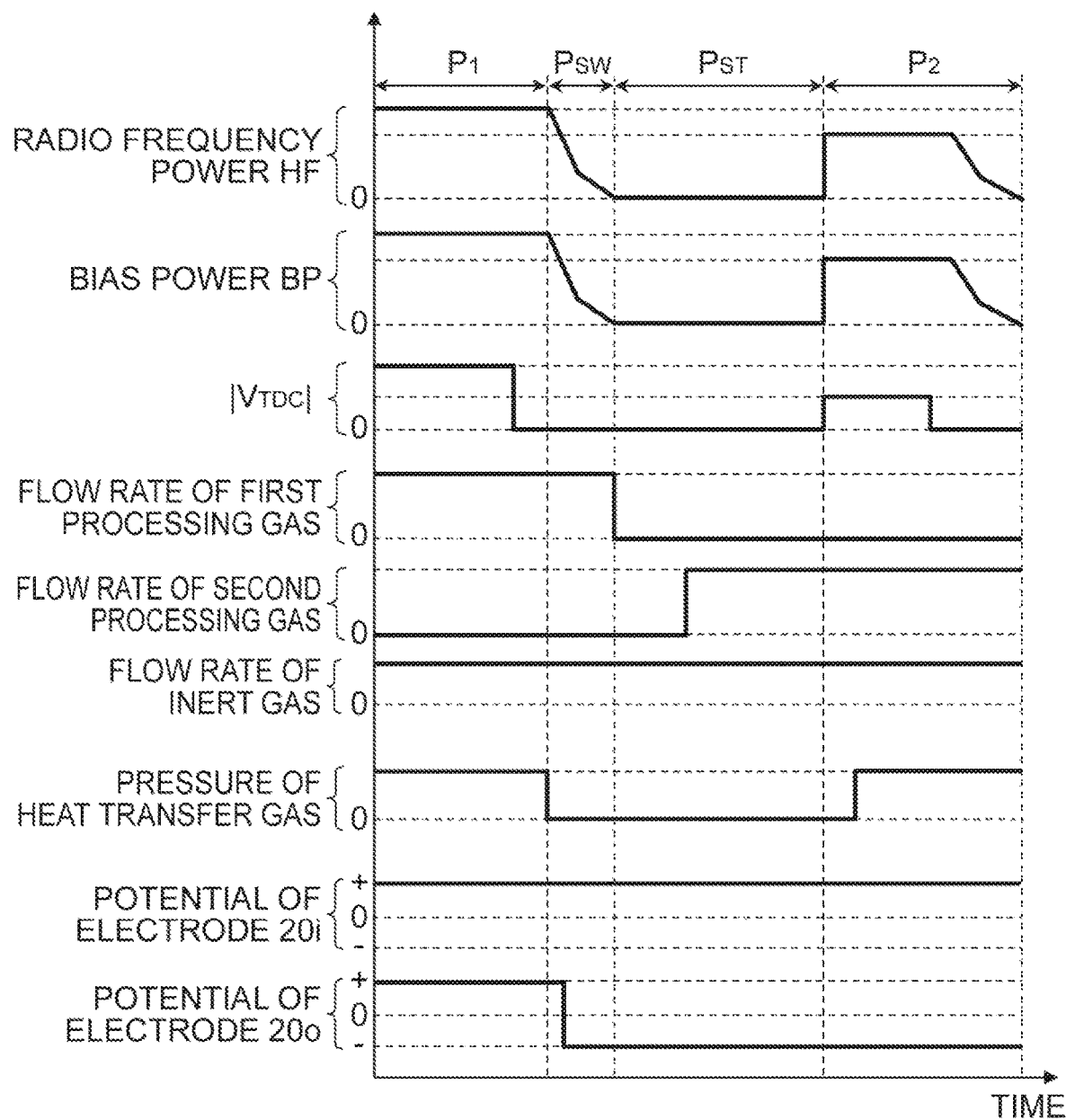
FIG. 5 is a timing chart of an example related to a plasma processing method according to one exemplary embodiment.

In the following description, FIG. 5 will be referred to in addition to FIG. 4. FIG. 5 is a timing chart of an example related to a plasma processing method according to one exemplary embodiment. In FIG. 5, the horizontal axis represents time. In FIG. 5, the vertical axis indicates the level of the radio frequency power HF, the level of the bias power BP, and the absolute value $|V_{TDC}|$ of the voltage applied to the upper electrode 30 by the DC power supply device 64. Further, in FIG. 5, the vertical axis further indicates the flow rate of the first processing gas, the flow rate of the second processing gas, and the flow rate of the inert gas supplied into the chamber 10. The vertical axis in FIG. 5 further indicates the pressure of the heat transfer gas supplied to the gap between the electrostatic chuck 20 and the edge ring ER. Further, in FIG. 5, the vertical axis further indicates the potential of the first electrode 20i and the potential of the second electrode 20o.

Figure 6A:
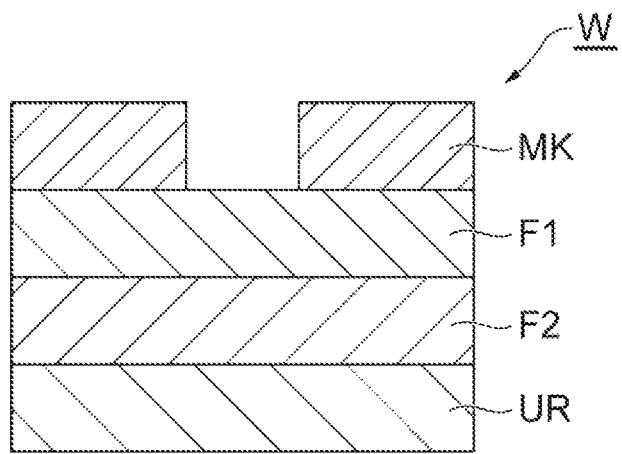
FIG. 6A is a partially enlarged cross-sectional view of an example substrate.

The method MT shown in FIG. 4 is executed in a state where the substrate W is placed on the substrate support 16. The substrate W may be placed on the first region 20a and held by the electrostatic chuck 20. FIG. 6A is a partially enlarged cross-sectional view of an example substrate. The method MT may be applied to the substrate W shown in FIG. 6A. The substrate W has a first film F1 and a second film F2. The first film F1 is provided on the second film F2. The first film F1 and the second film F2 may be formed of different materials. Each of the first film F1 and the second film F2 may be an organic film, a dielectric film, or a metal film. The substrate W may further have an underlying region UR and a mask MK. The second film F2 is provided on the underlying region UR. The mask MK is provided on the first film F1. The mask MK provides a pattern to be transferred to the first film F1.

Figure 6B:
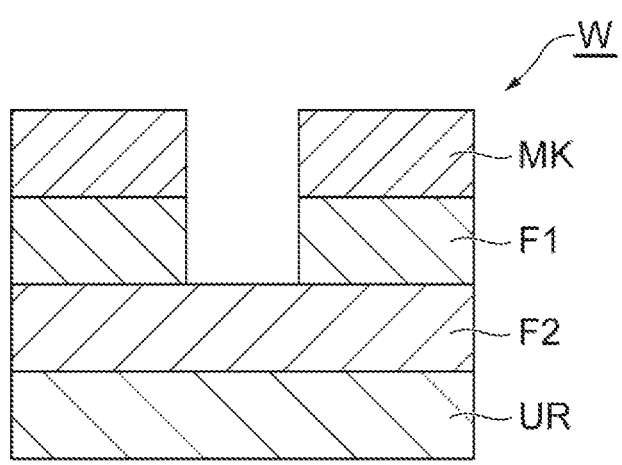
FIG. 6B is a partially enlarged cross-sectional view of the example substrate after execution of a step ST1.

The method MT starts in a step ST1. In the step ST1, the first plasma processing is executed on the substrate W. In the step ST1, the substrate W is processed by the plasma generated from the first processing gas in the chamber 10. The first plasma processing may be etching of the first film F1 with chemical species such as ions and radicals from plasma generated from the first processing gas. In the step ST1, as shown in FIG. 6B, the first film F1 is etched and the pattern of the mask MK is transferred to the first film F1.

In the period $P_1$ that is the execution period of the step ST1, the controller MC controls the gas supply unit to supply the first processing gas into the chamber 10. The first processing gas contains a gas for etching the first film F1. The first processing gas may further contain an inert gas. In the period $P_1$, the controller MC controls the exhaust device 50 to set the pressure of the gas in the chamber 10 to the designated pressure.

In the period $P_1$, the controller MC controls the radio frequency power supply 61 to supply the radio frequency power HF for plasma generation. In the period $P_1$, the radio frequency power HF may be continuously supplied. Alternatively, in the period $P_1$, the pulse of the radio frequency power HF may be intermittently or periodically supplied. In the period $P_1$, the controller MC controls the bias power supply 62 to supply the bias power BP to the lower electrode 18. In the period $P_1$, the bias power BP may be continuously supplied. Alternatively, the pulse of the bias power BP may be supplied intermittently or periodically in the period $P_1$.

In the period $P_1$, the controller MC may control the DC power supply device 64 to apply the negative DC voltage to the upper electrode 30. In the period $P_1$, the negative DC voltage from the DC power supply device 64 may be continuously applied to the upper electrode 30. Alternatively, in the period $P_1$, the pulse of the negative DC voltage from the DC power supply device 64 may be applied to the upper electrode 30 intermittently or periodically.

In the period $P_1$, the controller MC controls one or more power supplies 66 to set the potential of the first electrode 20$i$ and the potential of the second electrode 20$o$ to first potentials, respectively. The first potentials are ones out of the potentials same as each other and the potentials different from each other. In the example shown in FIG. 5, in the period $P_1$, the positive potentials same as each other are set to the first electrode 20$i$ and the second electrode 20$o$. In the period $P_1$, the controller MC controls the heat transfer gas supply unit 68 to supply the heat transfer gas to the gap between the electrostatic chuck 20 and the edge ring ER.

Figure 6C:
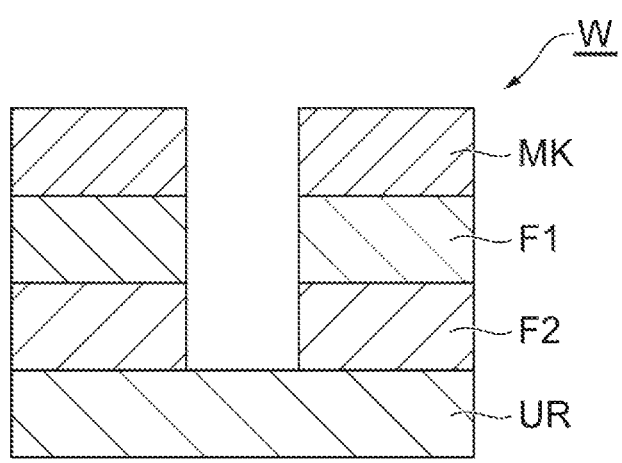
FIG. 6C is a partially expanded sectional view of the example substrate after execution of a step ST2.

The method MT further includes the step ST2. The step ST2 is performed after the step ST1. In the step ST2, the second plasma processing is executed on the substrate W. In the step ST2, the substrate W is processed by the plasma generated from the second processing gas in the chamber 10. The second plasma processing may be etching of the second film F2 with chemical species such as ions and radicals from plasma generated from the second processing gas. In the step ST2, as shown in FIG. 6C, the second film F2 is etched and the pattern of the mask MK is transferred to the second film F2.

In the period $P_2$ that is the execution period of the step ST2, the controller MC controls the gas supply unit to supply the second processing gas into the chamber 10. The second processing gas includes a gas for etching the second film F2. The second processing gas may further contain an inert gas. In the period $P_2$, the controller MC controls the exhaust device 50 to set the pressure of the gas in the chamber 10 to the designated pressure.

In the period $P_2$, the controller MC controls the radio frequency power supply 61 to supply the radio frequency power HF for plasma generation. In the period $P_2$, the radio frequency power HF may be continuously supplied. Alternatively, in the period $P_2$, the pulse of the radio frequency power HF may be intermittently or periodically supplied. In the period $P_2$, the controller MC controls the bias power supply 62 to supply the bias power BP to the lower electrode 18. In the period $P_2$, the bias power BP may be continuously supplied. Alternatively, the pulse of the bias power BP may be supplied intermittently or periodically in the period $P_2$.

The controller MC sets the effective value of at least one power of the radio frequency power HF or the bias power BP in the period $P_2$ to a value different from the effective value of the at least one power in the period $P_1$. In the example shown in FIG. 5, the effective value of the radio frequency power HF in the period $P_1$ is larger than the effective value of the radio frequency power HF in the period $P_2$. Further, in the example shown in FIG. 5, the effective value of the bias power BP in the period $P_1$ is larger than the effective value of the bias power BP in the period $P_2$. Note that, in each of the period $P_1$ and the period $P_2$, when the pulse of the radio frequency power HF is intermittently or periodically supplied, the effective value is represented by the product of the level of the pulse of the radio frequency power HF and the duty ratio. The duty ratio is a value of the ratio of ON time to the total of ON time and OFF time. The radio frequency power HF is supplied during the ON time. The radio frequency power HF is not supplied during the OFF time. Further, in each of the period $P_1$ and the period $P_2$, when the pulse of the bias power BP is intermittently or periodically supplied, the effective value is represented by the product of the level of the pulse of the bias power BP (the power level or the absolute value of the voltage level) and the duty ratio. The duty ratio is a value of the ratio of ON time to the total of ON time and OFF time. The bias power BP is supplied during the ON time. The bias power BP is not supplied during the OFF time.

In the period $P_2$, the controller MC may control the DC power supply device 64 to apply the negative DC voltage to the upper electrode 30. In the period $P_2$, the negative DC voltage from the DC power supply device 64 may be continuously applied to the upper electrode 30. Alternatively, in the period $P_2$, the pulse of the negative DC voltage from the DC power supply device 64 may be applied to the upper electrode 30 intermittently or periodically.

In the period $P_2$, the controller MC controls one or more power supplies 66 to set the potential of the first electrode 20$i$ and the potential of the second electrode 20$o$ to second potentials, respectively. The second potentials are others out of the potentials same as each other and the potentials different from each other. In the example shown in FIG. 5, different potentials are set to the first electrode 20$i$ and the second electrode 20$o$ in the period $P_2$. In the example shown in FIG. 5, in the period $P_2$, the potential of the first electrode 20$i$ is set to a positive potential and the potential of the second electrode 20$o$ is set to a negative potential. In the period $P_2$, the controller MC controls the heat transfer gas supply unit 68 to supply the heat transfer gas to the gap between the electrostatic chuck 20 and the edge ring ER.

The method MT further includes a step STA. The step STA is executed between the step ST1 and the step ST2. That is, the step STA is executed in the switching period $P_{SW}$ between the period $P_1$ and the period $P_2$. In the switching period $P_{SW}$, the respective potentials of the first electrode 20$i$ and the second electrode 20o are switched from the first potentials to the second potentials, in a state where plasma is generated in the chamber 10.

Figure 7:
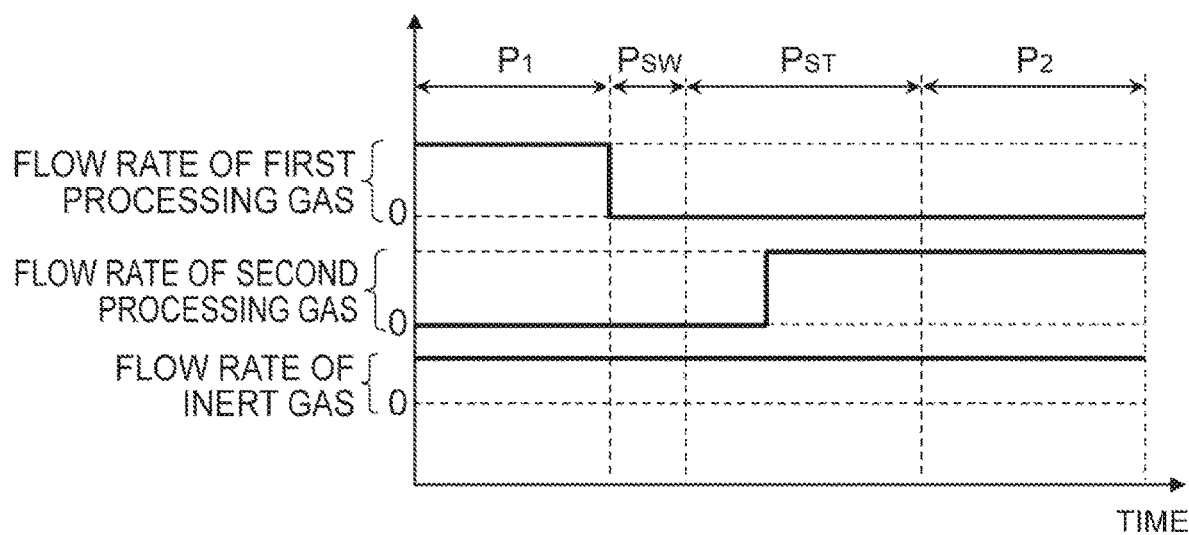
FIG. 7 is a timing chart of another example related to the plasma processing method according to one exemplary embodiment.

In one embodiment, as shown in FIG. 5, the switching period $P_{SW}$ is a period immediately after the period $P_1$. In the switching period $P_{SW}$, the controller MC may control the gas supply unit to maintain the flow rate of the first processing gas in the period $P_1$. In another embodiment, as shown in FIG. 7, the controller MC may control the gas supply unit to supply only the inert gas into the chamber 10 during the switching period $P_{SW}$. Further, in the switching period $P_{SW}$, the controller MC controls the exhaust device 50 to set the pressure of the gas in the chamber 10 to the designated pressure.

In the switching period $P_{SW}$, the controller MC controls the radio frequency power supply 61 and the bias power supply 62 to continuously supply the radio frequency power HF and the bias power BP in order to form a state in which plasma is generated from the gas in the chamber 10.

In the switching period $P_{SW}$, the controller MC controls the one or more power supplies 66 to switch the respective potential of the first electrode 20i and the second electrode 20o from the first potentials to the second potentials. In the example shown in FIG. 5, the potentials of the first electrode 20i and the second electrode 20o are switched from the potentials same as each other to the potentials different from each other. The respective potentials of the first electrode 20i and the second electrode 20o set in the switching period $P_{SW}$ are maintained also in the period $P_2$.

In one embodiment, the controller MC may control the radio frequency power supply 61 and the bias power supply 62 to change the level of at least one power of the radio frequency power HF and the bias power BP in the switching period $P_{SW}$.

In one embodiment, as shown in FIG. 5, the switching period $P_{SW}$ is a period immediately after the period $P_1$. In the switching period $P_{SW}$, the controller MC controls the radio frequency power supply 61 and the bias power supply 62 to gradually reduce the level of the at least one power from the level of the at least one power in the period $P_1$. In the example shown in FIG. 5, the level of the radio frequency power HF in the switching period $P_{SW}$ is gradually reduced from the level of the radio frequency power HF in the period $P_1$. Further, in the example shown in FIG. 5, the level of the bias power BP in the switching period $P_{SW}$ is gradually reduced from the level of the bias power BP in the period $P_1$. According to the present embodiment, the plasma density in the chamber 10 in the switching period $P_{SW}$ is lower than the plasma density in the chamber 10 in the period $P_1$. As a result, the processing of the substrate W is suppressed from progressing in the switching period $P_{SW}$.

In one embodiment, the controller MC controls the heat transfer gas supply unit 68 to stop the supply of the heat transfer gas to the gap between the electrostatic chuck 20 and the edge ring ER in the switching period $P_{SW}$. According to the present embodiment, the edge ring ER is prevented from being separated from the electrostatic chuck 20 in the switching period $P_{SW}$.

In one embodiment, the method MT may further include a step STB. The step STB is executed between the step STA and the step ST2. That is, the step STB is executed in the period $P_{ST}$ between the switching period $P_{SW}$ and the period $P_2$. The controller MC may control the radio frequency power supply 61 and the bias power supply 62 to stop the supply of the radio frequency power HF and the supply of the bias power BP in the period $P_{ST}$. In the embodiment, as shown in FIG. 5, the gas in the chamber 10 may be switched to the second processing gas in a state where plasma is not generated in the chamber 10.

In the method MT, the potential of the first electrode 20i and the potential of the second electrode 20o are respectively set to the ones out of the potentials same as each other and the potentials different from each other in the execution period (period $P_1$) of the first plasma processing. That is, the electrostatic chuck 20 functions in one mode of the unipolar mode and the bipolar mode in the period $P_1$. The potential of the first electrode 20i and the potential of the second electrode 20o are set to the others out of the potentials same as each other and the potentials different from each other in the execution period (period $P_2$) of the second plasma processing. That is, the electrostatic chuck 20 functions in the other mode of the monopolar mode and the bipolar mode in the period $P_2$. The mode of the electrostatic chuck 20 is switched from the one mode to the other mode in the switching period $P_{SW}$ between the period $P_1$ and the period $P_2$. Since plasma is generated in the chamber 10 in the switching period $P_{SW}$, generation of a large potential difference between the substrate W and the edge ring ER is suppressed. Therefore, it becomes possible to suppress discharge that may occur between the edge ring ER and the substrate W when switching the potentials set in the two electrodes (20i and 20o) of the electrostatic chuck 20 to hold the edge ring ER. As a result, for example, it is possible to prevent the particles attached to the edge ring ER below the back surface of the substrate W from being melted by the discharge and the melted particles from contaminating the substrate W.

Hereinafter, reference will be made to FIG. 8A, FIG. 8B, FIG. 9, FIG. 10, and FIG. 11. Each of these drawings is a timing chart of yet another example related to the plasma processing method according to one exemplary embodiment.

Figure 8A:
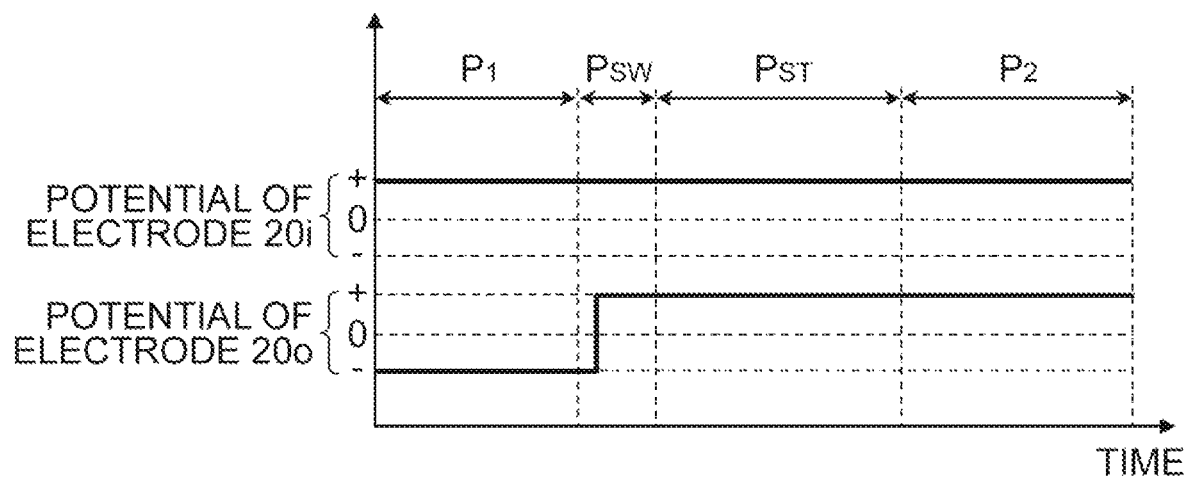
FIGS. 8A and 8B are timing charts of still another example related to the plasma processing method according to one exemplary embodiment.

As shown in FIG. 8A, the controller MC may set the respective potentials of the first electrode 20i and the second electrode 20o to the potentials different from each other in the period $P_1$, and to the potentials same as each other in the period $P_2$. The respective potentials of the first electrode 20i and the second electrode 20o are switched from the potentials different from each other to the potentials same as each other in the switching period $P_{SW}$ and are also maintained in the period $P_2$. In the example shown in FIG. 8A, the potential of the first electrode 20i is set to a positive potential and the potential of the second electrode 20o is set to a negative potential in the period $P_1$. In the example illustrated in FIG. 8A, the potential of the first electrode 20i and the potential of the second electrode 20o are set to the positive potentials same as each other in the period $P_2$.

Figure 8B:
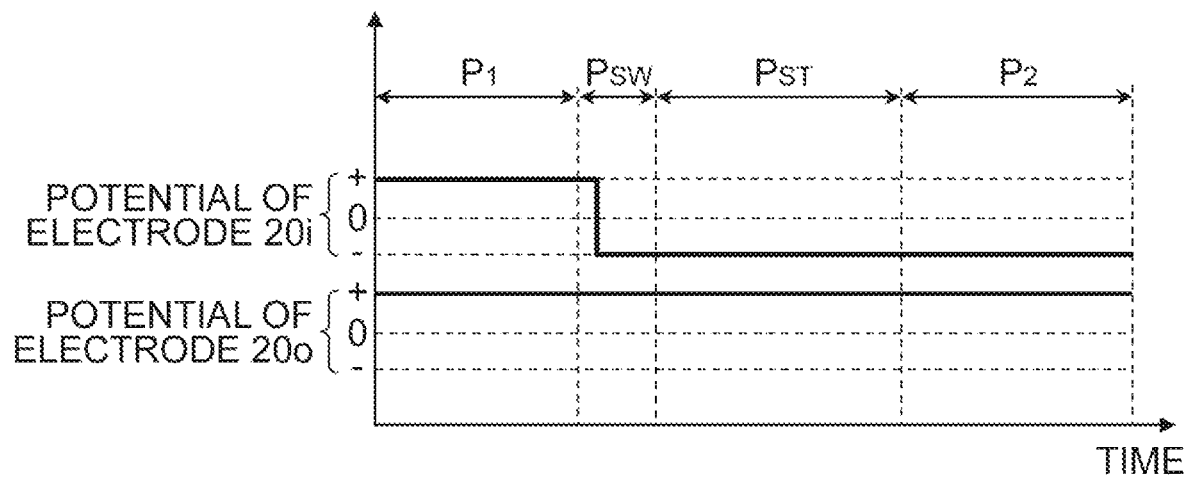

As shown in FIG. 8B, the controller MC may set the respective potentials of the first electrode 20i and the second electrode 20o to the potentials same as each other in the period $P_1$, and to the potentials different from each other in the period $P_2$. In the example illustrated in FIG. 8B, the potential of the first electrode 20i and the potential of the second electrode 20o are set to the positive potentials same as each other in the period $P_1$. In the example illustrated in FIG. 8B, the potential of the first electrode 20i is set to a negative potential and the potential of the second electrode 20o is set to a positive potential in the period $P_2$. In the example shown in FIG. 8B, the respective potentials of the first electrode 20i and the second electrode 20o are switched from the potentials same as each other to the potentials different from each other in the switching period $P_{SW}$, and are maintained also in the period $P_2$.

Figure 9:
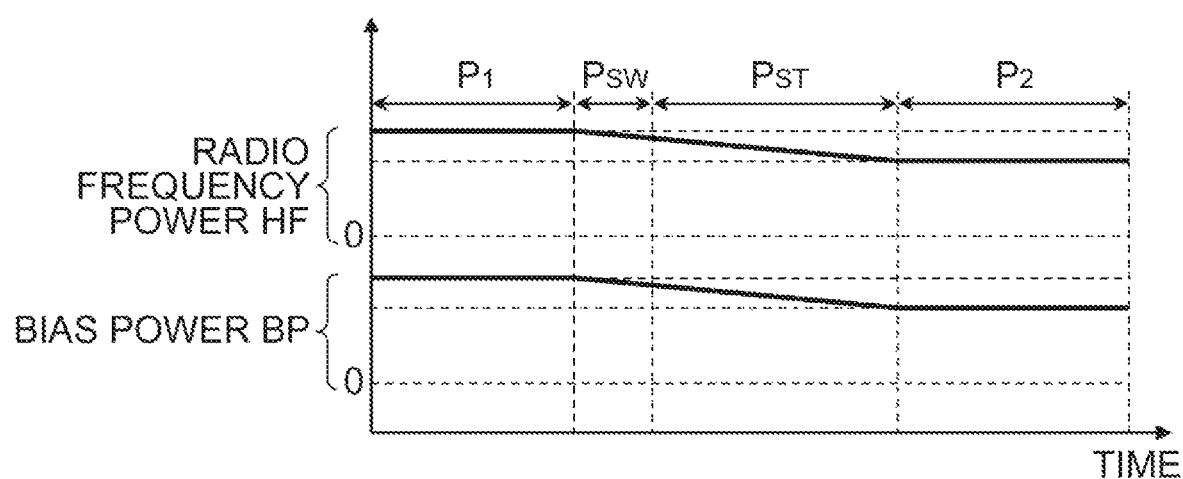
FIG. 9 is a timing chart of yet another example related to the plasma processing method according to one exemplary embodiment.

As shown in FIG. 9, between the period $P_1$ and the period $P_2$, that is, during the switching period $P_{SW}$ and the period $P_{ST}$, the level of the radio frequency power HF and/or the level of the bias power BP may not be set to zero. In the example shown in FIG. 9, both the level of the radio frequency power HF and the level of the bias power BP are not set to zero between the period $P_1$ and the period $P_2$. Between the period $P_1$ and the period $P_2$, the level of the radio frequency power HF may gradually change from the level in the period $P_1$ to the level in the period $P_2$. In addition, between the periods $P_1$ and $P_2$, the level of the bias power BP may gradually change from that level in the period $P_1$ to that level in the period $P_2$.

Figure 10:
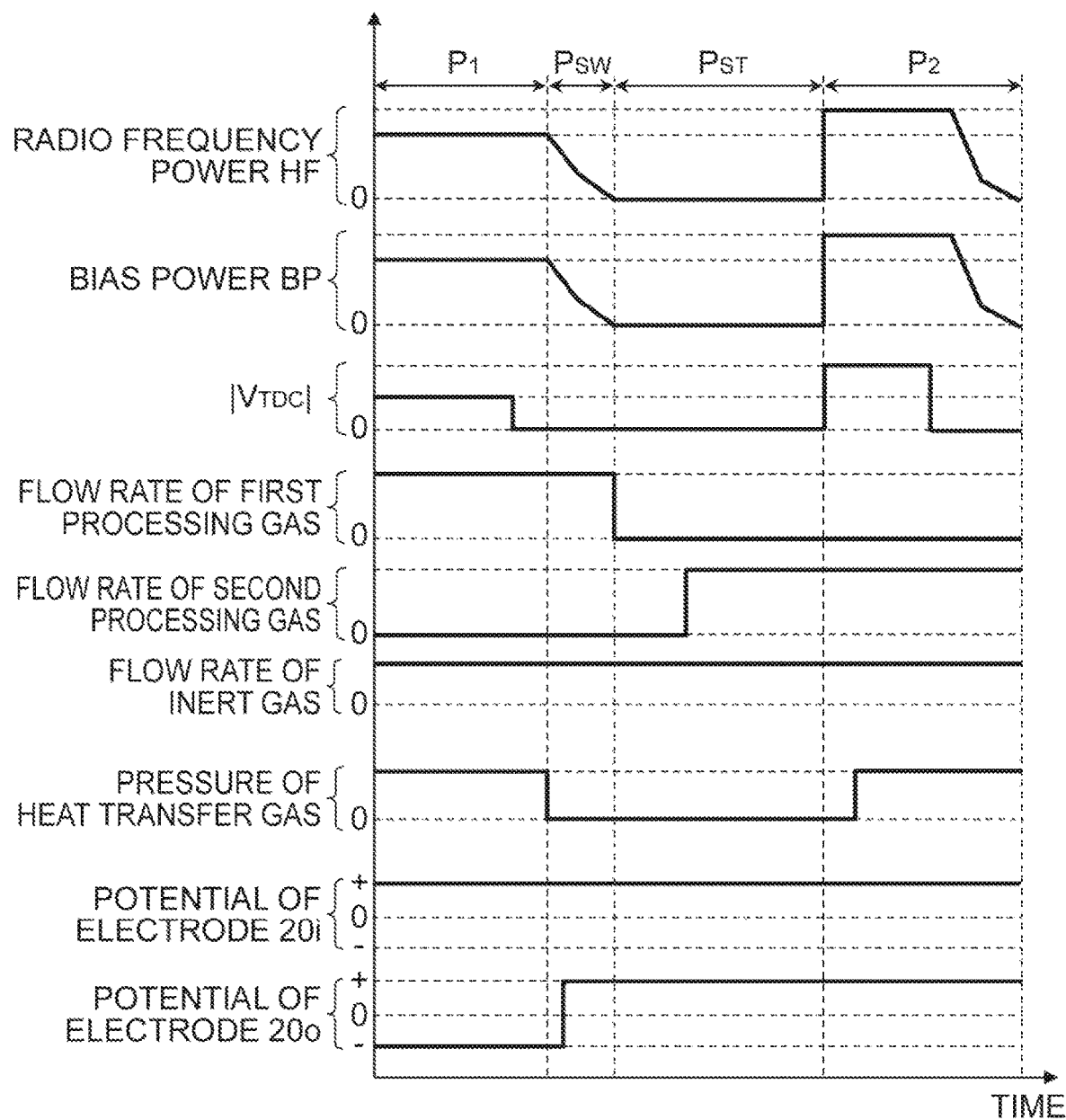
FIG. 10 is a timing chart of yet another example related to the plasma processing method according to one exemplary embodiment.

As shown in FIG. 10, the effective value of at least one power of the radio frequency power HF and the bias power BP in the period $P_1$ may be set to a value smaller than the effective value of the at least one power in the period $P_2$. In the example shown in FIG. 10, the effective value of the radio frequency power HF in the period $P_1$ is smaller than the effective value of the radio frequency power HF in the period $P_2$. Further, in the example shown in FIG. 10, the effective value of the bias power BP in the period $P_1$ is smaller than the effective value of the bias power BP in the period $P_2$. In this case, as shown in FIG. 10, the controller MC may set the respective potentials of the first electrode $20i$ and the second electrode $20o$ to the potentials different from each other in the period $P_1$, and to the potentials same as each other in the period $P_2$.

As shown in FIG. 11, the switching period $P_{SW}$ may be the period immediately before the period $P_2$. In this case, the controller MC may control the radio frequency power supply 61 and the bias power supply 62 to gradually increase the level of at least one power of the radio frequency power HF and the bias power BP during the switching period $P_{SW}$. For example, the level of the one power in the switching period $P_{SW}$ may be gradually increased toward the level of the at least one power in the period $P_2$. In the example shown in FIG. 11, in the switching period $P_{SW}$, the level of the radio frequency power HF is gradually increased toward the level in the period $P_2$. Further, in the example shown in FIG. 11, in the switching period $P_{SW}$, the level of the bias power BP is gradually increased toward the level in the period $P_2$.

While various exemplary embodiments have been described above, various additions, omissions, substitutions and changes may be made without being limited to the exemplary embodiments described above. Elements of the different embodiments may be combined to form another embodiment.

For example, in another embodiment, the plasma processing apparatus having the substrate support 16 may be a plasma processing apparatus different from the plasma processing apparatus 1. Examples of such a plasma processing apparatus include a capacitively coupled plasma processing apparatus different from the plasma processing apparatus 1, an inductively coupled plasma processing apparatus, or a plasma processing apparatus that generates plasma by surface waves such as microwaves.

Further, the first region $20a$ and the second region $20b$ may be provided as separate electrostatic chucks. That is, in another embodiment, the electrostatic chuck that holds the edge ring ER may be a separate electrostatic chuck from the electrostatic chuck that holds the substrate W.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support configured to support a substrate in the chamber, the substrate support having a lower electrode and an electrostatic chuck, the electrostatic chuck having a first electrode and a second electrode, the substrate support configured to hold an edge ring by an electrostatic force generated according to potentials respectively set on the first electrode and the second electrode;
   one or more power supplies electrically connected to the first electrode and the second electrode;
   a radio frequency power supply configured to supply radio frequency power to generate plasma in the chamber;
   a bias power supply configured to supply bias power to the lower electrode; and
   a controller configured to control the one or more power supplies, the radio frequency power supply, and the bias power supply,
   wherein the controller
   controls the radio frequency power supply and the bias power supply to perform a first plasma processing on a substrate placed on the substrate support, and controls the one or more power supplies to set a potential of the first electrode and a potential of the second electrode in an execution period of the first plasma processing to first potentials which are ones out of potentials same as each other and potentials different from each other, respectively,
   controls the radio frequency power supply and the bias power supply to execute a second plasma processing on the substrate placed on the substrate support, sets an effective value of at least one power of the radio frequency power or the bias power in an execution period of the second plasma processing to a value different from an effective value of the at least one power in the execution period of the first plasma processing, and controls the one or more power supplies to set the potential of the first electrode and the potential of the second electrode in the execution period of the second plasma processing to second potentials which are others out of the potentials same as each other and the potentials different from each other, respectively, and
   controls the one or more power supplies to switch respective potentials of the first electrode and the second electrode from the first potentials to the second potentials, in a switching period between the execution period of the first plasma processing and the execution period of the second plasma processing, in a state where plasma is generated in the chamber.

2. The plasma processing apparatus according to claim 1, wherein the effective value of the at least one power in the execution period of the first plasma processing is larger than the effective value of the at least one power in the execution period of the second plasma processing.

3. The plasma processing apparatus according to claim 2, wherein the controller
   controls the one or more power supplies to set the potential of the first electrode and the potential of the second electrode to the potentials same as each other in the execution period of the first plasma processing, respectively, and controls the one or more power supplies to set the potential of the first electrode and the potential of the second electrode to the potentials different from each other in the execution period of the second plasma processing, respectively.

4. The plasma processing apparatus according to claim 1, wherein the effective value of the at least one power in the execution period of the first plasma processing is smaller than the effective value of the at least one power in the execution period of the second plasma processing.

5. The plasma processing apparatus according to claim 4, wherein the controller controls the one or more power supplies to set the potential of the first electrode and the potential of the second electrode to the potentials different from each other in the execution period of the first plasma processing, respectively, and controls the one or more power supplies to set the potential of the first electrode and the potential of the second electrode to the potentials same as each other in the execution period of the second plasma processing, respectively.

6. The plasma processing apparatus according to claim 1, wherein the controller controls the radio frequency power supply and the bias power supply to change a level of the at least one power of the radio frequency power or the bias power, in the switching period.

7. The plasma processing apparatus according to claim 1, wherein the switching period is a period immediately after the execution period of the first plasma processing, and wherein the controller controls the radio frequency power supply and the bias power supply to gradually reduce a level of the at least one power in the switching period from the level of the at least one power in the execution period of the first plasma processing.

8. The plasma processing apparatus according to claim 1, wherein the switching period is a period immediately before the execution period of the second plasma processing, and wherein the controller controls the radio frequency power supply and the bias power supply to gradually increase a level of the at least one power in the switching period toward the level of the at least one power in the execution period of the second plasma processing.

9. The plasma processing apparatus according to claim 1, wherein the controller controls the radio frequency power supply and the bias power supply to stop supply of the radio frequency power and the supply of the bias power between the switching period and the execution period of the second plasma processing.

10. The plasma processing apparatus according to claim 1, wherein a level of the radio frequency power and/or a level of the bias power are/is not set to zero between the execution period of the first plasma processing and the execution period of the second plasma processing.

11. The plasma processing apparatus according to claim 7, further comprising:

a gas supply unit configured to supply a first processing gas for the first plasma processing and a second processing gas for the second plasma processing into the chamber, wherein in the switching period, the controller controls the gas supply unit to maintain a flow rate of the first processing gas in the execution period of the first plasma processing.

12. The plasma processing apparatus according to claim 1, further comprising:

a gas supply unit configured to supply a first processing gas for the first plasma processing, a second processing gas for the second plasma processing, and an inert gas into the chamber, wherein in the switching period, the controller controls the gas supply unit to supply only the inert gas into the chamber.

13. The plasma processing apparatus according to claim 1, wherein the first electrode and the second electrode extend in a circumferential direction around an axis extending in a vertical direction, and the first electrode extends closer to the axis than the second electrode.

14. The plasma processing apparatus according to claim 1, wherein as the potentials same as each other, positive potentials same as each other are set to the first electrode and the second electrode, respectively, and wherein as the potentials different from each other, one of a positive potential and a negative potential is set for the first electrode, and the other of the positive potential and the negative potential is set for the second electrode.

15. The plasma processing apparatus according to claim 1, further comprising:

a heat transfer gas supply unit configured to supply heat transfer gas to a gap between the electrostatic chuck and the edge ring, wherein the controller controls the heat transfer gas supply unit to stop supply of the heat transfer gas to the gap in the switching period.

16. A plasma processing method comprising:

executing a first plasma processing on a substrate placed on a substrate support in a chamber of a plasma processing apparatus, wherein a potential of a first electrode and a potential of a second electrode of an electrostatic chuck of the substrate support configured to hold an edge ring are set to first potentials in an execution period of the first plasma processing, respectively, the first potentials being ones out of potentials same as each other and potentials different from each other;

executing a second plasma processing on the substrate placed on the substrate support in the chamber, wherein in an execution period of the second plasma processing, an effective value of at least one of radio frequency power for plasma generation and bias power supplied to a lower electrode of the substrate support is set to a value different from an effective value of the at least one power in the execution period of the first plasma processing, and the potential of the first electrode and the potential of the second electrode are set to second potentials, respectively, the second potentials being others out of the potentials same as each other and the potentials different from each other, and switching respective potentials of the first electrode and the second electrode from the first potentials to the second potentials, in a switching period between the execution period of the first plasma processing and the execution period of the second plasma processing, in a state where plasma is generated in the chamber.

17. The plasma processing method according to claim 16,
wherein the substrate has a first film and a second film,
wherein the first film is etched by the first plasma processing, and
wherein the second film is etched by the second plasma processing.

\* \* \* \* \*